US006648654B1

(12) United States Patent  
Akram et al.

(10) Patent No.: US 6,648,654 B1
(45) Date of Patent: Nov. 18, 2003

(54) ELECTRICAL CONNECTOR

(75) Inventors: Salman Akram, Boise, ID (US); David R. Hembree, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,720

(22) Filed: Aug. 31, 2000

Related U.S. Application Data

(62) Division of application No. 09/265,906, filed on Mar. 10, 1999.

(51) Int. Cl.[7] .............................................. H01R 12/00
(52) U.S. Cl. .............................................. 439/70
(58) Field of Search ........................... 439/66, 70, 71, 439/82, 84

(56) References Cited

U.S. PATENT DOCUMENTS

| | | | | |
|---|---|---|---|---|
| 3,735,466 A | | 5/1973 | Jensen | 29/203 B |
| 4,616,406 A | | 10/1986 | Brown | 29/588 |
| 4,750,092 A | | 6/1988 | Werther | 361/400 |
| 4,752,250 A | * | 6/1988 | Seidler | 439/751 |
| 4,772,864 A | | 9/1988 | Otto et al. | 333/238 |
| 4,871,317 A | | 10/1989 | Jones | 439/68 |
| 4,909,746 A | * | 3/1990 | Scholz | 439/82 |
| 5,043,790 A | | 8/1991 | Butler | 357/68 |
| 5,067,233 A | | 11/1991 | Solomon | |

(List continued on next page.)

FOREIGN PATENT DOCUMENTS

| | | | |
|---|---|---|---|
| JP | 08203644 A | * | 8/1996 |
| JP | 408203644 A | * | 8/1996 |
| WO | WO 90/11629 | * | 10/1990 |

OTHER PUBLICATIONS

"Condel Test Socket Specifications," Liberty Research Socket Specifications, Web Page:www.liberty–research.com/sktspcs.htm; Feb. 10, 1998.
"Holeshot Test Socket and Adapter for Area Array Packages," Liberty Research, Web Page: www.liberty–research.com/holeshot.htm; Feb. 10, 1998.
"Penta O Probe Sheet," Interconnect Devices, Inc., catalog page. No date.
"Plunger Tip Styles by Size," Catalog page from Interconnect Devices, Inc. No date.
"Probe Plunger Tip Application Guide," Interconnect Devices, Inc., Web Page: www.idinet.com/aguide.htm; Dec. 20, 1998.
Series 654 Ball Grid Array Socket (on 1.27 mm pitch); catalog page, Wells Electronics, Inc., South Bend, Indiana. No date.

(List continued on next page.)

Primary Examiner—Lynn Feild
Assistant Examiner—Thanh-Tam Le
(74) Attorney, Agent, or Firm—TraskBritt

(57) ABSTRACT

In a socket to test semiconductor die, a recessed socket contact that avoids pinching the die contacts is disclosed. The socket contacts allow for smaller socket holes and allow denser contact spacing. A variety of embodiments are presented that are suitable for use depending on the spacing between the conductors. For more closely spaced conductors, the body of the socket contact comprises a head, a spring coupled to the head, and a shaft coupled to the spring. No outer shell is needed for the spring, as the nonconductive sides of the socket hole serve that function. For conductors spaced furthur apart, the body of the socket contact comprises a metal shaft having an aperture. Compression causes the shaft to close around the slit, thereby decreasing the amount of lateral buckling. For even more densely spaced contacts, semiconductor fabrication techniques are used to construct a dense array of contacts.

5 Claims, 9 Drawing Sheets

U.S. PATENT DOCUMENTS

| | | | |
|---|---|---|---|
| 5,173,055 A | | 12/1992 | Grabbe |
| 5,283,459 A | | 2/1994 | Hirano et al. ............... 257/419 |
| 5,374,204 A | * | 12/1994 | Foley et al. ................ 439/751 |
| 5,386,626 A | | 2/1995 | Cheng ........................ 29/843 |
| 5,509,814 A | * | 4/1996 | Mosquera ................... 439/82 |
| 5,518,410 A | * | 5/1996 | Masami ...................... 439/71 |
| 5,545,050 A | | 8/1996 | Sato et al. ................. 439/331 |
| 5,653,601 A | * | 8/1997 | Martucci et al. ............. 439/82 |
| 5,737,818 A | | 4/1998 | Frank et al. |
| 5,741,741 A | | 4/1998 | Tseng |
| 5,834,062 A | | 11/1998 | Johnson et al. ............ 427/256 |
| 5,850,693 A | | 12/1998 | Guran et al. ................ 29/884 |
| 5,896,655 A | | 4/1999 | Knödler ...................... 29/884 |
| 5,962,921 A | | 10/1999 | Farnworth et al. .......... 257/773 |
| 5,984,694 A | * | 11/1999 | Sinclair ....................... 439/70 |
| 6,007,349 A | * | 12/1999 | Distefano et al. ............ 439/71 |
| 6,049,977 A | | 4/2000 | Atkins et al. |
| 6,084,421 A | | 7/2000 | Swart et al. ................ 324/755 |
| 6,092,282 A | | 7/2000 | Roberts |
| 6,174,172 B1 | * | 1/2001 | Kazama ...................... 439/66 |
| 6,190,181 B1 | * | 2/2001 | Affolter et al. ............... 439/70 |
| 6,193,524 B1 | * | 2/2001 | Chang ........................ 439/66 |
| 6,397,460 B1 | | 6/2002 | Hembree |

OTHER PUBLICATIONS

Series 654 Ball Grid Array Socket (on 1.5 mm pitch); catalog page, Wells Electronics, Inc., South Bend, Indiana. No date.

"Series 655 OTBGA Burn–In/Test Socket (Pinch Contact)," Wells–CTI, Web Page: www.wellscti.com/ser655p.htm; Dec. 16, 1998.

"Series 655 OTBGA Socket (Y Contact)," Wells–CTI, Web Page: www.wellscti.com/ser655.htm; Dec. 16, 1998.

"Test Sockets and Adapters for Area Array Packages," Liberty Research, Web Page: www.liberty–research.com/arrayinfo.htm; Feb. 10, 1998.

* cited by examiner

ELECTRICAL CONNECTOR

This application is a divisional of application Ser. No. 09/265,906, filed Mar. 10, 1999.

TECHNICAL FIELD

The present invention relates generally to devices and methods for providing electrical connection between two electronic components. More specifically, the present invention relates to a socket contact configured to establish electrical communication between a semiconductor die and a test device as well as methods for forming the socket contact.

BACKGROUND OF THE INVENTION

Testing a semiconductor die often involves establishing an electrical connection between testing equipment and the circuitry of a die. Testing may be performed on an unpackaged die that has been singulated from a semiconductor wafer, on a section of dies that are still part of the wafer, or on all of the dies on a wafer. Moreover, a bare die that has undergone packaging steps may also be tested. One example of such a die is a "flip chip," wherein conductive material such as solder balls is attached directly to the bond pads or electrical traces formed in the surface of the die; the die is then "flipped," or mounted face down, so that the solder balls may connect with contact members of another device. Another example is a "chip scale package," which includes a die along with one or more package elements, such as encapsulating material in the form of thin protective coatings formed of glass or other materials bonded to the face and back side of the die; in addition, solder balls may be attached to electrical traces in the surface of the die or directly to the die's bond pads through openings in the encapsulating material. A Ball Grid Array (BGA) serves as yet another example that involves even more packaging: the die is wire bonded to the top of a substrate and encapsulated, and solder balls are bonded to electrical traces at the bottom of the substrate that lead to the wire bonds.

The device to be tested will hereinafter be referred to as an integrated circuit chip, or IC chip, regardless of the singulation or packaging state of the die that forms all or part of the IC chip. One method of testing the IC chip involves placing the chip into a socket, which comprises a body with holes that span through the body. These holes house contacts that are aligned with electrical contact points of the IC chip. For purposes of explanation only, it will be assumed that the contact points of the IC chip are solder balls. Often, the socket includes a lid that, when closed, pushes the solder balls of the IC chip against the heads of the socket's contacts. Once the IC chip has been inserted, the socket is then plugged into a printed circuit board (PCB). This insertion often involves a biasing force in the opposite direction of the lid's pushing force. To ensure electrical communication between the IC chip and the PCB without the risk of breaking the socket contacts, the socket contacts are configured to be resilient to the compression resulting from these forces. One such configuration for doing so involves the use of "pogo pin" contacts. A pogo pin can comprise an electrically conductive inner shaft, an electrically conductive outer shell concentric to the inner shaft and defining the head of the contact, and an electrically conductive spring between the inner shaft and outer shell. When the pogo pin undergoes compression, the inner shaft is pushed into the outer shell despite the spring's bias. Ideally, signals received at the head of the outer shell will conduct through the spring to the inner shaft and onward to devices that may be connected to the inner shaft. However, such a design allows for unneeded electrical communication along the entire surface of the outer shell.

As an alternate configuration, buckle beams may be used. Buckle beams are essentially a thin, somewhat rigid length of conductive material that will buckle in response to compression from the IC chip and the PCB being pushed toward each other. The problem with buckle beams is that the holes housing the beams must be wide enough to accommodate the horizontal motion of the beams as they buckle. The buckling space required limits the density of beams per unit area that can be achieved. In addition, buckle beams tend to rotate during buckling. Thus, in certain aspects, pogo pins and buckle beams run contrary to the need in the art for electrical contacts that require minimal space and material.

Returning to the testing process, the PCB with the connected socket is placed in a chamber, wherein the IC chips are tested while subjected to an elevated temperature. Such testing is referred to as burn-in testing. The socket's contacts provide electrical communication between the IC chip and signals sent through the PCB from the test equipment. Once the test is complete, the chip is removed from the socket. IC chips which do not pass the testing are discarded, and chips that pass may undergo further testing and ultimately be used as components in electronic devices.

Further testing and use of these chips, however, depends upon the ability of the solder balls to continue to function after their interaction with the socket's contacts. Prior art socket contacts have heads that are configured through their flexibility to actively exert a force against the chip's solder balls, wherein the force is generally transverse to the biasing force that pushes the chip into the socket. The effect of this transverse force is to pinch the solder balls, thereby severely damaging them and making further communication with the chip difficult. Such socket contacts include the aptly named "pinch contact" found in the Series 655 OTBGA Burn-in/ Test Socket'sold by Wells Electronics. Another series 655 OTBGA Socket by Wells uses a Y-shaped contact. The Y-shaped contact is further described in U.S. Pat. No. 5,545,050, by Sato et al.; indicating that the head of the Y-shaped contact is flexible, which allows it to "snugly" accommodate a hemispherical conductor of an IC package. (Sato at col. 4, In. 25–30.) Thus, the Y-shaped contact continues the tradition of applying a pinching action to the electrical contacts of a device.

Still other examples of contact heads are illustrated by references from Interconnect Devices, Inc. (IDI). Among the examples are plunger probe tips having crown-shaped heads, whose sharp prongs tend to gouge the surface of the chip's contact, be it a solder ball or flat pad. In addition, IDI discloses a concave tip that might accommodate hemispherical chip contacts such as solder balls, but may provide insufficient electrical communication for other contacts, such as those configured as flat pads.

Thus, in addition to the needs in the art discussed above concerning the body of an electrical connector, there is also a need in the art for an electrical connector having a head that reduces the damage to the electrical contacts of IC chips during connection and is configured to accommodate more than one type and size of chip contact. More specifically, there is a need in the art for a socket contact that minimizes the damage to various IC chip contacts during IC chip testing.

SUMMARY OF THE INVENTION

Accordingly, the current invention provides electrical contacts as well as methods for forming them. One preferred embodiment comprises a contact as part of a socket used for testing a semiconductor die, wherein the contact has a head that defines a recess, and the head is coupled to an elongated conductive body configured to fit within a socket. More specifically, the head comprises a portion defining the perimeter of the head, with other portions of the head lower than the perimeter. In one exemplary embodiment, this head takes the form of a planar ring with a sidewall sloping downward from the ring toward the central axis running the length of the contact. This sidewall transitions to a generally planar section that is parallel to, yet lower than, the perimeter ring. Various preferred embodiments address varying degrees of transition and planarity of the portions of the contact head.

Other preferred embodiments address the body of an electrical contact, including one embodiment comprising a head, a shaft, and a spring coupling the head to the shaft. In a more specific embodiment, the spring's coils define circles of differing circumferences. Another exemplary preferred embodiment comprises a metallic tube for the contact body, wherein the tube defines at least one slit. Yet other preferred exemplary embodiments address silicon contacts and methods for forming them. Specifically, semiconductor fabrication techniques are used to define an array of silicon contacts, and the contacts are singulated while maintaining their alignment within the array.

Still other preferred embodiments include the recessed contact head as described above in combination with the contact bodies just described. These embodiments include methods and devices wherein the head is formed separately from the body and attached thereto, as well as methods and devices wherein the head is integral to the body.

DETAILED DESCRIPTION OF THE PREFERRED EMBODIMENTS

Figure 1:
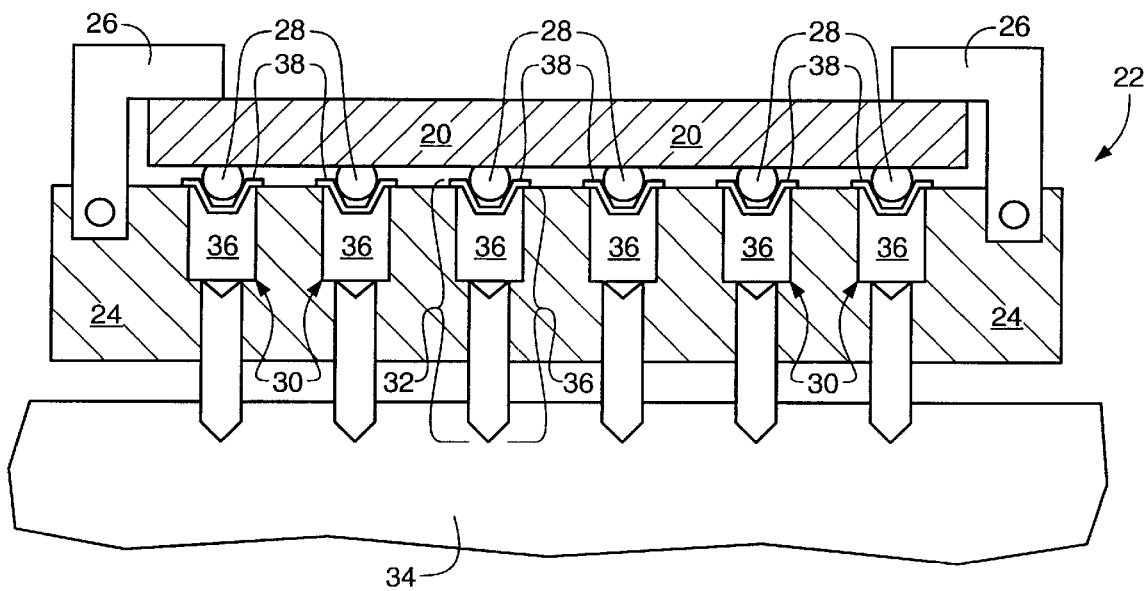
FIG. 1 is a cross-sectional view of one exemplary embodiment of the current invention.

FIG. 1 depicts one exemplary embodiment of the current invention in the context of testing an IC chip. IC chip 20, which could be a bare die, a flip chip, a chip scale package, or a die at any stage of packaging, is enclosed within a socket 22. The socket 22 comprises a body 24 made of electrically nonconductive material as well as a holding mechanism 26 for biasing the IC chip 20 against the body 24. In this particular example, the holding mechanism 26 is a pair of hinged lids, but those skilled in the art know that there are many ways to position the IC chip 20. In this position, the IC chip's contacts 28, which are assumed to be solder balls for purposes of explanation, are aligned with holes 30 extending in generally one direction through the body 24. Socket contacts 32 extend through these holes 30 and electrically connect the chip's contacts 28 and the PCB 34. Each socket contact body 36, depicted in an exemplary generic form in FIG. 1, is configured to be resilient along an axis defined by the biasing force that pushes the PCB 34 against the socket contacts 32. This axis is often referred to as the "z-axis" and is further described below. Such resiliency can be achieved through known methods, such as with pogo pins or buckle beams, or through embodiments of the current invention which will be described below.

Figure 2:
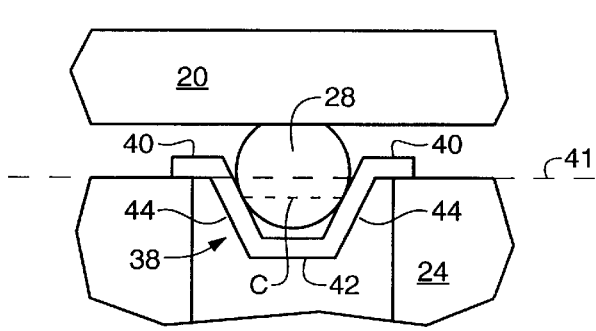
FIG. 2 is a close-up view of a portion of FIG. 1.
Figure 3:
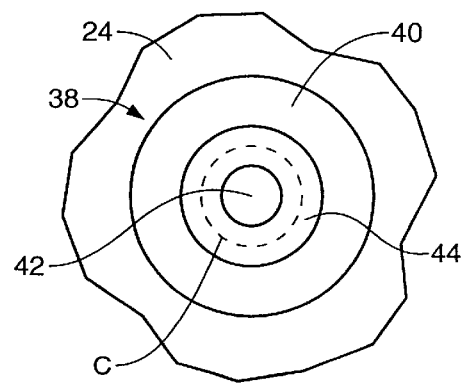
FIG. 3 is a top-down view of the illustration in FIG. 2.

The head 38 of each socket contact 32 is configured to receive a chip contact 28. Contrary to the prior art contacts which have heads in the form of spears; chisels, needles, crowns, or pinchers, exemplary embodiments of the current invention include socket contacts having heads that define grooves or recesses or cavities or cups. FIG. 2, for example, is a close-up of the socket contact head 38 depicted in FIG. 1. In this cross-sectional view, one can see that the socket contact head 38 comprises a first portion 40 defining a plane 41 and an opening. In this embodiment, the plane 41 is parallel to the IC chip 20 positioned within the socket 22. Similarly, a second portion 42 is parallel to plane 41 and is lower than the first portion 40, or at least farther away from the positioned IC chip 20. Joining the first portion 40 and the second portion 42 is a third portion 44. In this exemplary embodiment, the third portion 44 defines a frustum-shaped or frustoconical wall that slopes toward the center of the socket contact 32 from the first portion 40 to the second portion 42. In doing so, this socket contact head 38 offers a continuous contact region along an entire cross-sectional circumference C of the chip's contact 28. This can be seen better in the top-down view of FIG. 3. Without limiting the invention, it is believed that by providing such a continuous contact region, any force biasing the chip contact 28 and the socket contact 32 toward each other is distributed, thereby helping to maintain the integrity of the chip contact 28. It is possible that the compressive force applied to the chip contact 28 may be enough to deform it. In that case, the chip contact 28 may flatten against the third portion 44 and perhaps against the second portion 42 as well. This would serve to increase the contact region without inflicting the damage that prior art contacts would cause with their sharp pikes and corners. It should be further noted that, in this embodiment and from this viewpoint, the first portion 40 is annular, or ring-shaped.

Figure 4A:
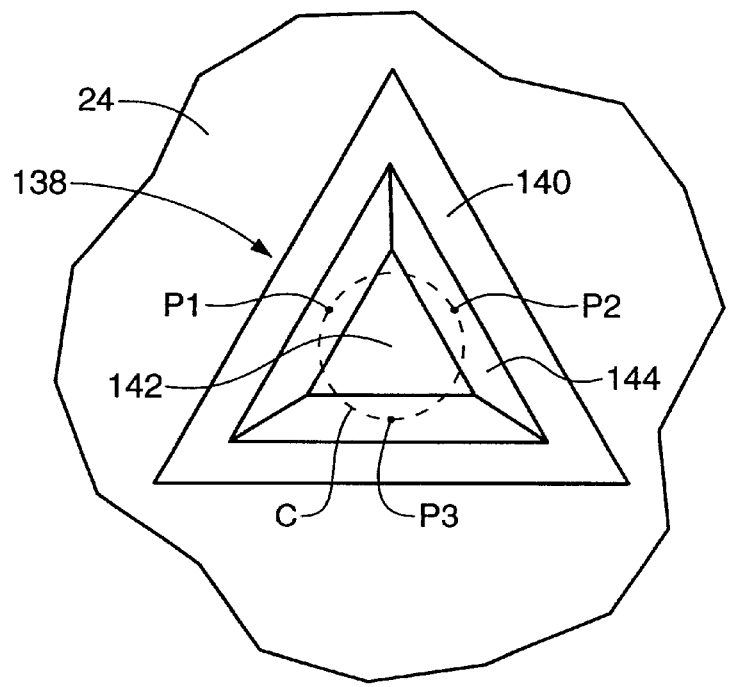
FIGS. 4A and 4B are top-down views of a second and third exemplary embodiment of the current invention.

Despite the benefits from the area of connection offered by the exemplary embodiment above, it may not be necessary to provide connection along the entire circumference C. Accordingly, the current invention includes within its scope electrical connectors having heads that define polygons in a top-down view. FIG. 4A, for example, illustrates a socket contact head 138 comprising a triangular first portion 140, second portion 142, and third portion 144. Assuming the chip contact 28 is still a semispherical solder ball, then electrical connection may occur at three points P1, P2, and P3, along a particular cross-sectional circumference C. FIG.

Figure 4B:
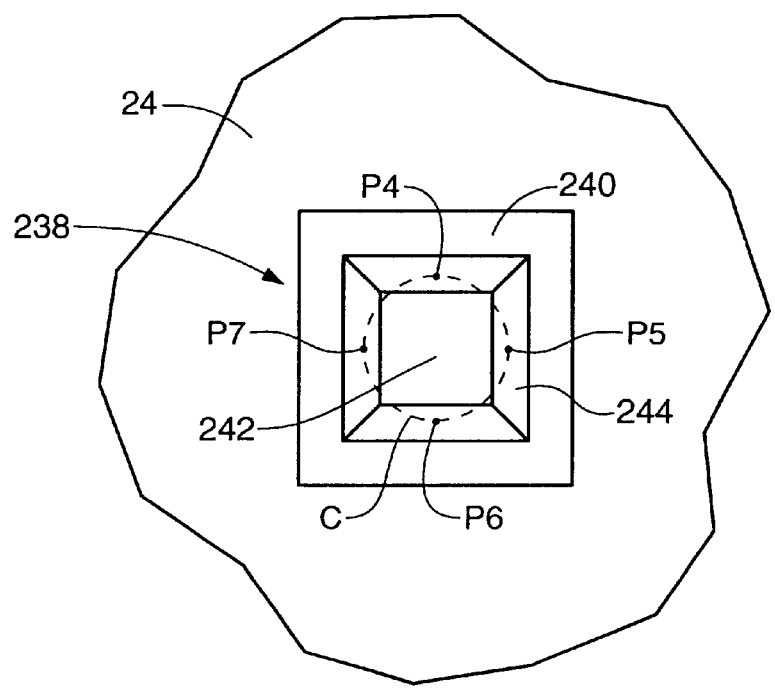

4B depicts yet another socket contact head 238 having a rectangular first portion 240, second portion 242, and third portion 244. Accordingly, electrical connection may occur at four points P4–P7 along a particular cross-sectional circumference C. While the biasing force will be distributed to fewer points in the embodiments shown in FIGS. 4A and 4B in comparison to FIG. 3, it should be noted that the contact points P1–P3 and P4–P7 occur on planar areas of the socket contact heads 138 and 238. As a result, deformation of the chip's contact 28 will be minimal.

Figure 5A:
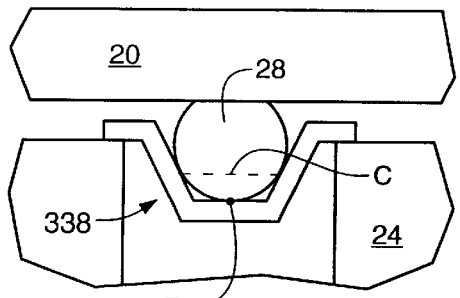
FIGS. 5A and 5B are cross-sectional views of fourth and fifth exemplary embodiments of the current invention.
Figure 5B:
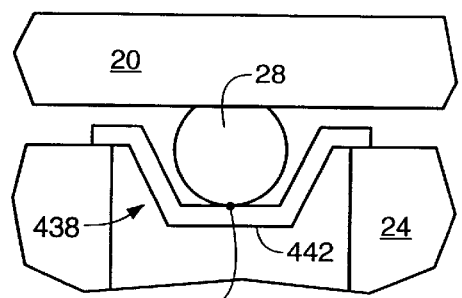

In the embodiments discussed above, the socket contact heads 38, 138, and 238 have been sized so that only the third portion 44, 144, or 244 is configured to touch the chip contact 28. However, other embodiments are included wherein the head of the electrical connector is sized differently in relation to the chip's contact. In FIG. 5A, a socket contact head 338 is sized and shaped to allow for connection not only along the cross-sectional circumference C but also at a point B at the bottom of the chip contact 28. In FIG. 5B, socket contact head 438 is sized and shaped to initially touch point B at the bottom of the chip contact 28. Once again it is possible that some deformation of chip contact 28 will occur as it is pressed against socket contact head 438, thereby increasing the area of contact. However, since chip contact 28 is abutting a generally flat plane 442, deformation will not be as damaging as it would be with prior art socket contact heads.

Figure 6A:
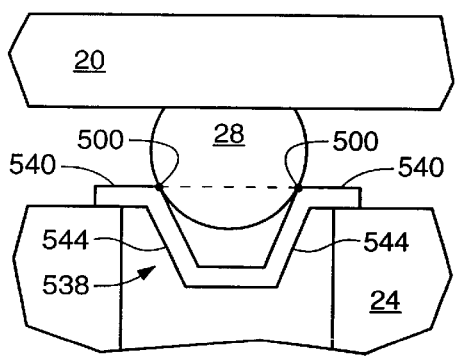
FIGS. 6A–6D are cross-sectional views of sixth, seventh, eighth, and ninth exemplary embodiments of the current invention.
Figure 6B:
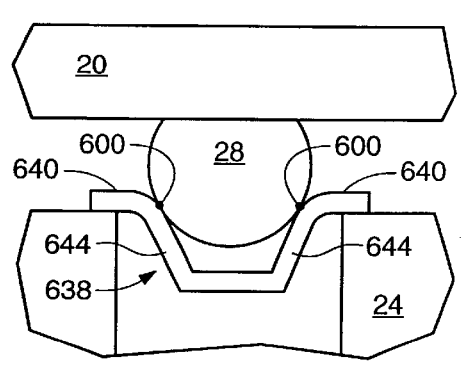

As shown in FIG. 6A, a socket contact head 538 can also be sized so that the chip contact 28 touches the socket contact head 538 where the first portion 540 and third portion 544 meet. In the FIG. 6A embodiment, the area where these two portions 540 and 544 meet defines a corner 500. As a result, it may be desirable in certain embodiments to provide a more rounded area 600, as seen in FIG. 6B, representing the transition from the first portion 640 to the third portion 644 of socket contact head 638. Further, FIG. 6C's embodiment demonstrates that it may be beneficial in some embodiments to include an area 700 providing a more gradual or rounded transition from the third portion 744 to the second portion 742 of socket contact head 738. Moreover, it is not required in some embodiments that the first and second portion be planar. The socket contact head 838 in FIG. 6D comprises a first portion 840 that curves outward in a convex manner—toward the positioned IC chip 20 and its contact 28. On the other hand, the second portion 842 and third portion 844 curve inward in a concave fashion—away from the positioned IC chip 20 and its contact 28. As a result, the portions 840, 842, and 844 define a contact surface 800 that is generally if not completely complementary to the shape of the chip contact 28. Specifically, the curved shape of surface 800 corresponds to the curved shape of the chip contact 28.

Figure 7:
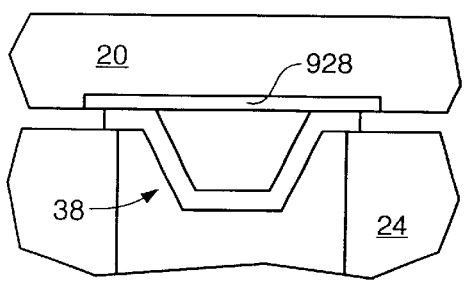
FIG. 7 is a cross-sectional view of a tenth exemplary embodiment of the current invention.

However, it may be helpful in some embodiments to maintain the planarity of at least the first portion 40. FIG. 7 depicts the socket contact head 38 depicted in FIG. 2 with a different chip contact 928. In this case, chip contact 928 is planar, as may be found in Land Grid Array (LGA) packages. In LGA packages, a plurality (array) of contact pads ("lands") are used to communicate with the packaged die circuitry. As is preferred, the planar first portion 40 of the socket contact head 38 corresponds to the planar chip contact 928.

In the embodiments described above, it is noted that the contact head's perimeter—or portion of the contact head that is outermost from the central longitudinal axis of the contact—is also the "highest" area of the head or farthest from the body of the contact. In certain circumstances, the outermost portion could also be described as being closest to the site in which the contact of an IC chip will occupy while being housed in the socket In addition, because the remainder of the head declines and/or converges toward the central longitudinal axis, these exemplary embodiments can be considered to be defining a central or inner recess or cavity.

In many embodiments, an electrical connector head such as the socket contact heads described above is preferably made of an electrically conductive material. More preferably, the embodiments are made of metal. Exemplary materials for the electrical connector head include gold, copper, beryllium copper, and stainless steel. The shape of the electrical connector head may be formed through chemical etching techniques—including wet or dry (plasma) etching—or through stamping. Further, the head may be integral to the body of the electrical connector or may be a discrete part that is attached to the body. For example, it is possible to shape the head by die-stamping a metal sheet, then attaching the completed head to an electrical connector body using a conductive adhesive, such as a Silva-based material (Silva Filled Conductive Chip Adhesive is a conductive ink composed of silver flakes in an epoxy base which can be purchased from Ablestick Laboratories of Gardena, Calif.). In some exemplary embodiments, it is preferable to choose a metal type and thickness so that flexibility in the head, if any, does not result in any pinching action against the chip contact upon biasing the IC chip and socket contact against each other.

Figure 8:
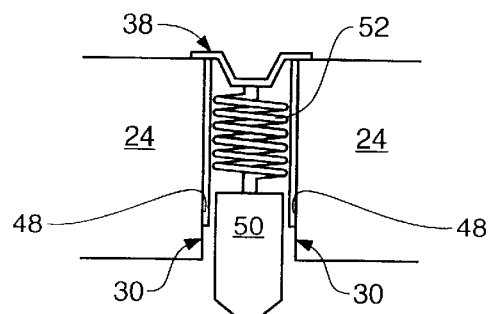
FIG. 8 is a cross-sectional view of an eleventh exemplary embodiment of the current invention.

As stated above, the electrical contact head may be associated with an electrical contact body that is already known in the art. In the context of socket contacts, for example, FIG. 8 illustrates the socket contact head 38 as part of a pogo pin 46. The socket contact head 38 is connected to, if not an integral part of, an outer shell 48. The socket contact head 38 is also connected to an inner shaft 50 through a spring 52. However, if the outer shell 48 is made of an electrically conductive material, then the entire outer shell 48 is available to receive current, when all that is really needed is for current to travel from the head 38 to the shaft 50 through the spring 52 (as well as in the reverse direction). In addition, the hole 30 in body 24 must be wide enough to accommodate the diameter of the outer shell 48. As technology allows for small chip contacts 28 that may then be more closely packed together, it is desirable to densify the socket holes 30 in a corresponding manner. The additional width needed for the outer shell 48 runs counter to that desire.

Figure 9:
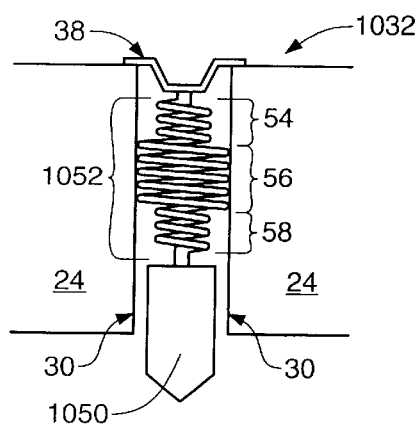
FIG. 9 is a cross-sectional view of a twelfth exemplary embodiment of the current invention.

Accordingly, the current invention includes electrical contacts that dispense with an outer shell. As one example, FIG. 9 depicts a socket contact 1032 comprising a socket contact head 38 coupled to a shaft 1050 through a spring 1052. The spring 1052, in turn, has sections defining varying widths. For instance, spring 1052 comprises a first section 54 and second section 58, whose coils define a circle having a diameter of about 1 mil; as well as a third section 56 having coils that define a circle having a diameter of about two mils. The third section 56 is wide enough to contact the socket's body 24. The absence of an outer shell allows for a narrower hole 30 and therefore allows for a denser array of holes 30 in the socket body 24.

Figure 10:
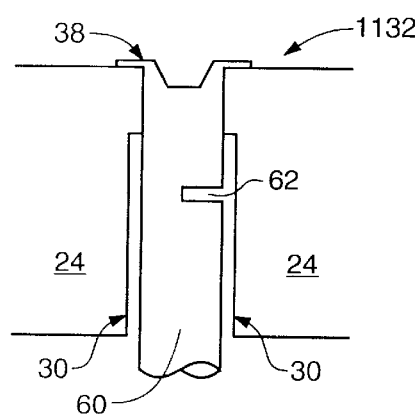
FIG. 10 is a cross-sectional view of a thirteenth exemplary embodiment of the current invention.
Figure 11:
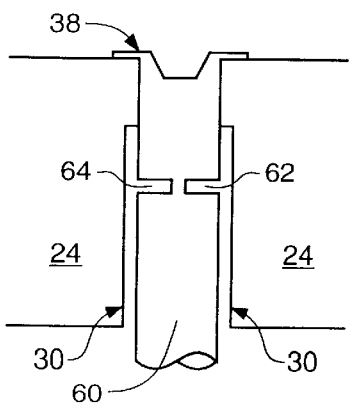
FIG. 11 is a cross-sectional view of a fourteenth exemplary embodiment of the current invention.
Figure 12A:
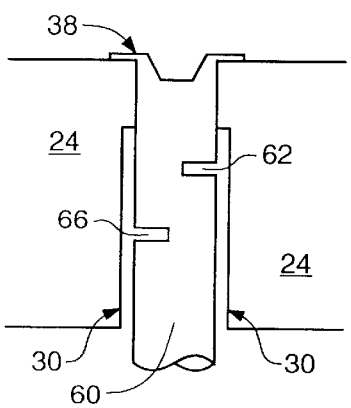
FIGS. 12A–12F are cross-sectional views of an additional exemplary embodiments of the current invention.

Another electrical contact body that is known in the art is the buckle beam, and the current invention includes electrical contact heads such as the ones described above attached to such a body. However, to avoid the problems associated with buckle beams, the current invention also includes within its scope embodiments such as the one in FIG. 10, wherein a socket contact 1132 comprises a socket contact head 38 and a tube 60 having at least one aperture 62. Thus, when a compressive force is applied to the socket contact 1132, at lease some of that force will cause the tube 60 to collapse in on itself, initiating the closure of the aperture 62, rather than cause the tube 60 to buckle laterally. Thus, hole 30 need not be as large as when it accommodates buckle beams. The tube is nevertheless resilient enough to generally return to its precompression shape once the compressive force eases. Further, the tube 60 is configured to fit snugly against the socket body 24 somewhere along its length. Other embodiments have a plurality of apertures, such as FIG. 11, wherein two apertures, 62 and 64, appear at the same depth but on different sides of the tube 60. FIG. 12A depicts two apertures, 62 and 66, at different depths along the tube 60. The tube 60 in these and other embodiments is preferably made of metal such as gold, copper, beryllium copper, or stainless steel. The aperture or apertures can be formed by sawing. In addition, since it is also preferred to make the socket contact head from metal, it is possible to form the socket contact head 38 and tube 60 from the same piece of metal.

Figure 12B:
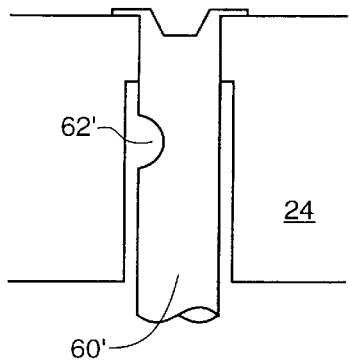

Still other embodiments include other contacts with bodies defining a generally continuous profile but for at least one deformation or deviation. For example, apertures of different shapes may be formed. While the contacts in FIGS. 10, 11, and 12A define a rectangular profile with a deformation in the form of a second, smaller rectangle (or a slit), it is possible to define a different deformation by using a different saw blade, by using a particular etching technique, or simply by stamping a dent into the contact body. FIG. 12B exemplifies such a different deformation—in this case a semicircular deformation 62' is defined from a body 60' having a generally rectangular profile defined by the body's cylindrical shape. Moreover, the contact body in the embodiments described above, as well as others, can be hollow. Methods for making such a hollow body can be similar to those known in the art for making the outer shell 48 of the pogo pin 46 depicted in FIG. 8. A hollow body allows embodiments such as the one depicted in FIG. 12C, wherein metal strips 65 and 67 integrally extend from and join cylindrical portions of the contact body 60'. That embodiment can be formed by sawing on opposite ends of the hollow body, as depicted in FIG. 12D. FIG. 12D is a top-down cross-sectional view of the contact in FIG. 12C. Saw blades 69 move in the direction indicated by arrows 71, thereby defining strips 65 and 67 from the cylindrical shell body 60'. Saw blades 69 can represent two blades that saw the body 60' simultaneously or one saw blade that saws the body 60' at different places and at different times. FIG. 12E is another side view of this embodiment, similar to FIG. 12C, only at a slightly different angle than that of FIG. 12C. In FIG. 12E, the strip 65 is closer to the viewer than strip 67. In response to a compressive force along the length of the contact body 60', the strips 65 and 67 can buckle, allowing the body 60' to at least partially close the gap 73. In yet another embodiment, seen in FIG. 12F, the strips 65 and 67 may be deformed or "pre-dented" through stamping or other methods, to encourage an inward collapse in response to compression. Once again, these embodiments can return to their shape as the compression eases.

Figure 13A:
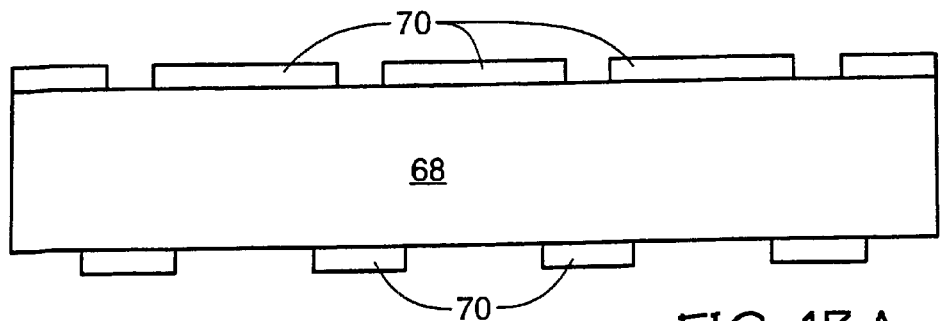
FIGS. 13A–13H illustrate steps of another exemplary embodiment of the current invention.
Figure 13B:
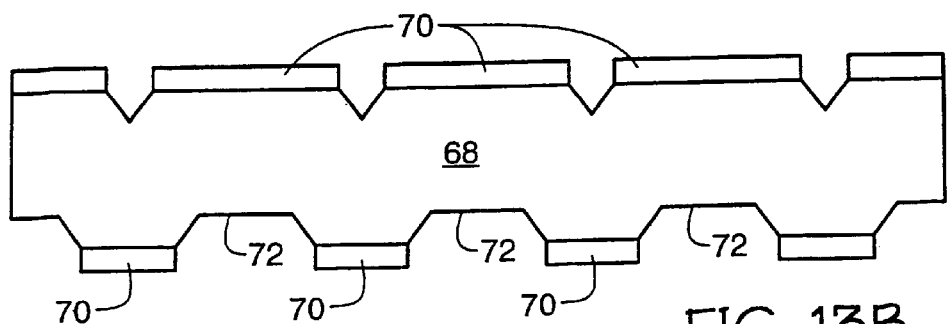
Figure 13C:
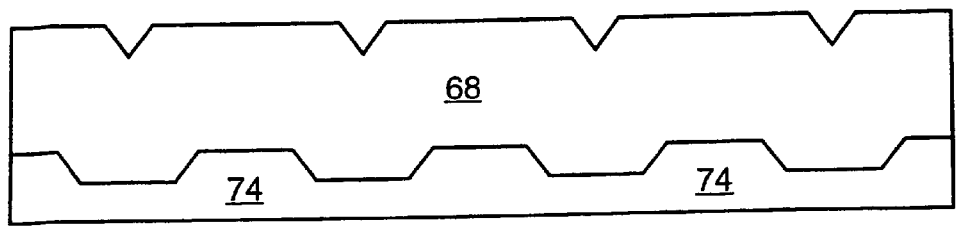

While all-metal electrical contacts are preferable in terms of electrical conductivity, it may sometimes be preferable to use semiconductive materials for at least the body of the electrical contact, as this allows for the use of fabrication techniques that support scaling on par with the techniques used to define the contact pitch in the IC chip that is to be tested. FIGS. 13A through 13H demonstrate such fabrication techniques that may be used in embodiments of the current invention to form an electrical contact. FIG. 13A shows a semiconductor substrate 68 that has been patterned on the top and bottom with photoresist 70 so as to define a plurality of contact bodies. For purposes of explanation, it is assumed that the substrate is made of silicon that has been doped to encourage electrical conductivity. Next, as seen in FIG. 13B, the shapes of the top and bottom of the in-process contact bodies are defined through etching. FIG. 13B indicates that an anisotropic etch has been performed on the top and bottom. The fact that plateaus 72 remain on the bottom suggests that the anisotropic etch on the bottom was either shorter in time or involved a lower etch rate than the anisotropic etch on the top; or that the openings defined by the photoresist on the bottom were larger than the openings on top. Partially defining the contacts also establishes the placement of each prospective contact relative to the other prospective contacts. Any silicon remaining between the designated contact sites continues to determine the alignment of each contact in the array of contacts until that silicon is replaced with another material. Such a step is illustrated in FIG. 13C, where the photoresist is removed and the position of each in-process contact is maintained relative to the other in-process contacts, in this case through the application of a z-axis elastomer 74 to the bottom of the substrate. The z-axis elastomer 74 is an adhesive material that is capable of conducting electricity along a dimension in response to pressure applied along that dimension. The direction of pressure is usually designated as being aligned with a z-axis, wherein the elastomer sheet is generally parallel to a plane defined by an x and y axis (and wherein the x, y, and z axes are 90° from each other). Such an elastomer is generally nonconductive along the x and y axes.

Figure 13D:
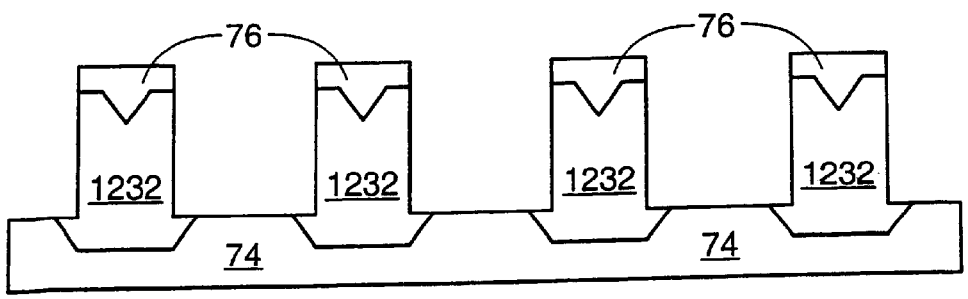
Figure 13E:
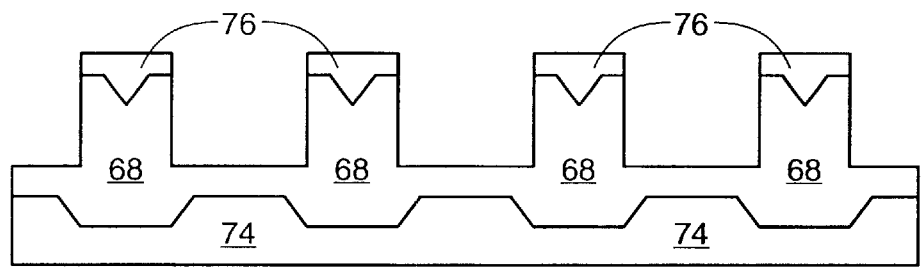
Figure 13F:
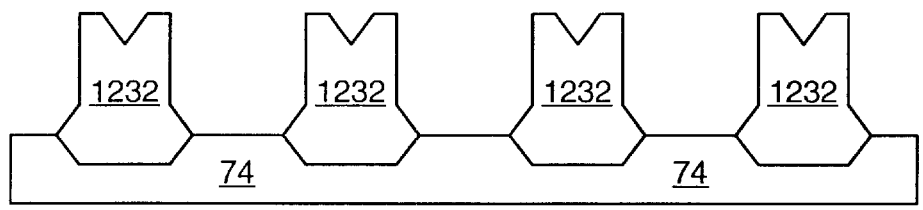
Figure 13G:
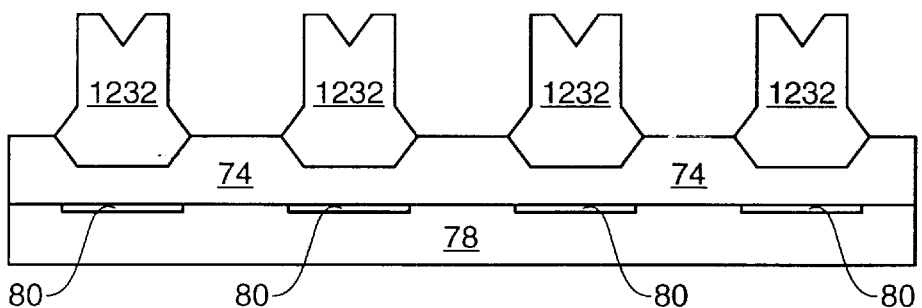
Figure 13H:
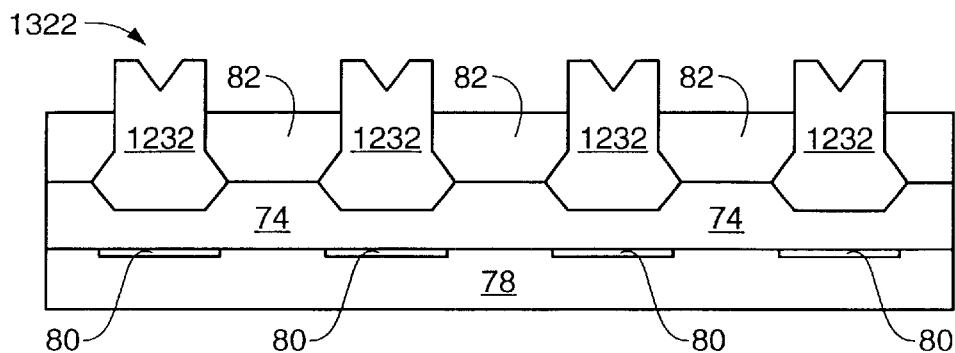

Once the alignment of the in-process contacts has been reinforced, the contacts are then singulated by removing the remaining silicon interconnecting the in-process contacts. One option for doing so is shown in FIG. 13D, wherein additional photoresist 76 is patterned to protect the tops of the in-process contacts, and the substrate 68 subsequently undergoes an isotropic etch to form the sidewalls of the in-process contacts. Preferably, the isotropic etch is continued to completely separate the contacts 1232, as depicted in FIG. 13D. Alternatively, the isotropic etch may be used to partially define the sidewalls (FIG. 13E), with an anisotropic etch completing the singulation (FIG. 13F). Once the additional photoresist 76 has been removed, FIG. 13G shows that the array of discrete contacts 1232, along with the z-axis elastomer 74 maintaining their placement, may then be moved to a substrate 78 such as a PCB having conductive leads 80 that end under the contacts 1232. When the contacts 1232 undergo compression, the z-axis elastomer 74 provides resiliency as well as electrical communication between the contacts 1232 and the leads 80. It may also be desirable in some embodiments to deposit an insulation layer 82 between the contacts 1232 for added stability. This can be accomplished with a blanket deposition of an insulating layer followed by an etchback, with photoresist protecting the contacts. The end result is the socket 1322 illustrated in FIG. 13H. As with previous sockets, an IC chip's contacts will connect with the socket's contacts 1232, and the PCB's conductive leads 80 can be wire bonded to test equipment for testing the IC chip.

Figure 14A:
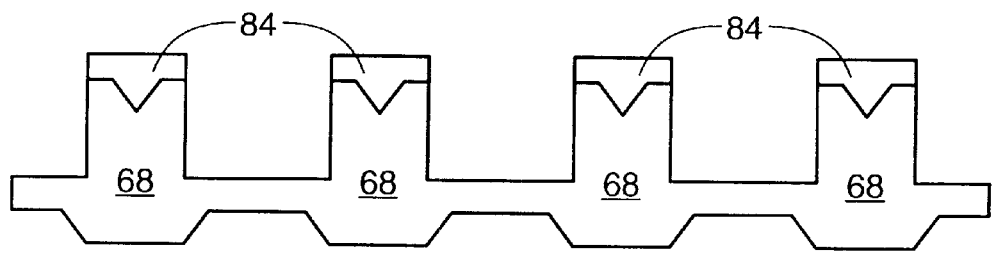
FIGS. 14A–14C depict alternate steps of yet another exemplary embodiment of the current invention.
Figure 14B:
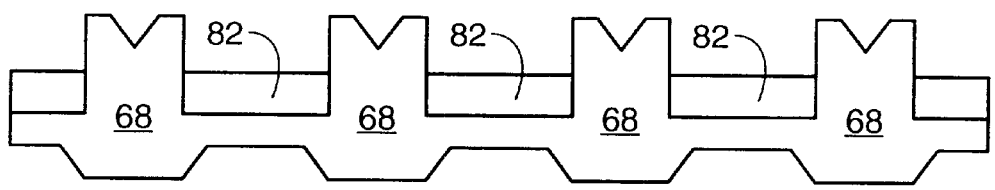
Figure 14C:
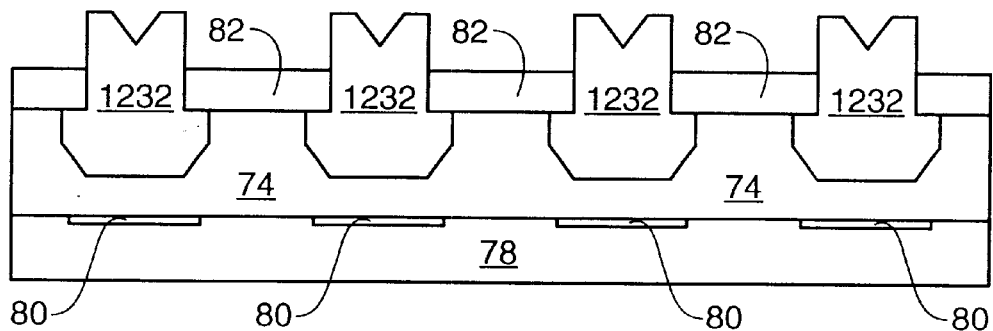

Variations of the processes described above also fall within the scope of the current invention. For example, sidewall definition and singulation of the contacts can be accomplished with a saw such as those used to singulate dice from a wafer. In addition, there are ways to retain the alignment of the contacts 1232 other than using the z-axis elastomer 74. For example, after the step illustrated in FIG. 13B, an alternate step shown in FIG. 14A may be taken. That figure illustrates that the photoresist 70 has been removed and another layer of resist 84 has been applied and patterned to protect the tips of the in-process contacts. FIG. 14A further indicates that the sidewalls of the inprocess contacts have been defined, either through etching or sawing. Subsequently, the insulation layer 82 is provided to a desired height, and the resist 84 is removed (FIG. 14B). In this embodiment, it is the insulation layer 82 that maintains the alignment of the in-process contacts. Singulation may then be completed by etching or sawing from the bottom of the substrate 68, the result of which is seen in FIG. 14C. The z-axis elastomer 74 may still be used, but in this embodiment, it may be initially deposited on the substrate 78, with the singulated contacts 1232 and insulation 82 being placed thereover.

Figure 15A:
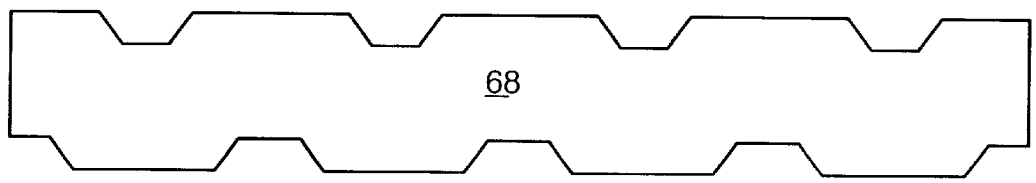
FIGS. 15A–15C illustrate alternate steps of still another exemplary embodiment of the current invention.
Figure 15B:
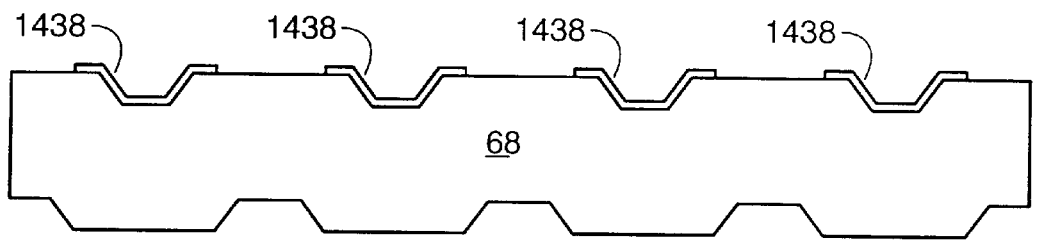

In addition, a metallization step may be added to make the tips of the contacts 1232 more electrically conductive. Moreover, it should be noted that the tips of the contacts may be formed in accordance with the configurations described above for providing a contact head with a groove or recess or cavity or defining a cup shape, with the v-shaped recesses depicted in the contacts 1232 of FIG. 13H and 14C serving as one example. As another example, the etch time, etch rate, or resist opening could be established, as is known in the art, to define a contact tip that more closely resembles the socket contact head of FIG. 2. The result of such a step appears in FIG. 15A. A metal layer could then be provided and subsequently patterned using photoresist to define heads 1438 of the in-process contacts. Additional steps as illustrated in FIGS. 13C–13H may be performed to reach the result depicted in FIG. 15C, wherein each contact 1232 has a metallic head 1438 comprising a first portion 1540 defining a plane 1541 and an opening. In this embodiment, the plane 1541 is parallel to the substrate 78. Similarly, a second portion 1542 is parallel to plane 1541 and is lower than the first portion 1540, or at least closer to the substrate 78. Joining the first portion 1540 and the second portion 1542 is a third portion 1544. In this exemplary embodiment, the third portion 1544 defines a frustum-shaped or frustoconical wall that slopes in toward center of the socket contact 1232 from the first portion 1540 to the second portion 1542. As an alternative to using a metallization step, it is also within the scope of the current invention to form a metal head separately and attach it to a silicon contact.

One skilled in the art can appreciate that, although specific embodiments of this invention have been described for purposes of illustration, various modifications can be made without departing from the spirit and scope of the invention. For example, just as embodiments concerning a socket contact head may be associated with prior art socket contact bodies, so too can embodiments of socket bodies be used in conjunction with prior art socket heads. Moreover, concerning embodiments involving the testing of electronic devices, the devices and methods covered by the current invention could be used in tests including burn-in, connectivity checks, open/short tests, and multichip module tests, as well as others. As for embodiments addressing which IC chips could be tested, the current invention includes embodiments that involve testing packages such as dual in-line (DIP), zig-zag in-line (ZIP), leadless chip carrier (LCC), small outline package (SOP), thin small outline package (TSOP), quad flat pack (QFP), small outline j-bend (SOJ), and pin grid array (PGA) packages in addition to the bare die, chip-scale package, flip chip, BGA, and LGA mentioned above. Moreover, the methods and devices described above are not limited to testing circumstances; rather, they could also be used for interconnect devices in permanent or semipermanent packaging. Accordingly, the invention is not limited except as stated in the claims.

What is claimed is:

1. An electrical connector used to temporarily directly connect an IC chip to a substrate, comprising:
    a socket contact head configured to temporarily receive at least a portion of said IC chip; and
    a socket contact body coupled to said socket contact head comprising:
        a first portion;
        at least one resilient temporarily deformable strip integrally extending from said first portion having a first shape, said at least one resilient temporarily substantially deformable strip including an aperture extending across a portion thereof for a portion of said at least one resilient temporarily deformable strip to be deformed by collapsing upon itself upon an application of compressive force thereto into a second shape when said at least a portion of said IC chip contacts at least a portion of said socket contact head and to resiliently return to said first shape from said second shape when said at least a portion of said IC chip is removed from contact with a portion of said socket contact head; and
        a second portion integrally extending from said at least one resilient temporarily deformable strip.

2. The electrical connector in claim 1, wherein said first portion and said second portion are hollow.

3. The electrical connector in claim 2, wherein said first portion and said second portion are cylindrical and define a common central axis.

4. The electrical connector in claim 3, wherein said at least one strip is bent toward said central axis.

5. The electrical connector in claim 3, wherein said at least one strip is configured to bend toward said central axis in response to a compressive force along said central axis.

* * * * *

UNITED STATES PATENT AND TRADEMARK OFFICE
CERTIFICATE OF CORRECTION

PATENT NO.   : 6,648,654 B1
DATED        : November 18, 2003
INVENTOR(S)  : David R. Hembree It is certified that error appears in the above-identified patent and that said Letters Patent is hereby corrected as shown below:

Title page,
Item [75], Inventors, delete "Salman Akram, Boise, ID (US)"; and "Warren M. Farnworth, Nampa, ID (US)"
Item [56], References Cited, OTHER PUBLICATIONS, insert -- Smith, "Circuits, Devices and Systems" Fourth Edition, 1984. --
Item [57], ABSTRACT,
Line 11, change "furthur" to -- further --

Drawings,
FIG. 1, change reference numeral "36" to -- 32 --
Replace Fig. 1 with the following:

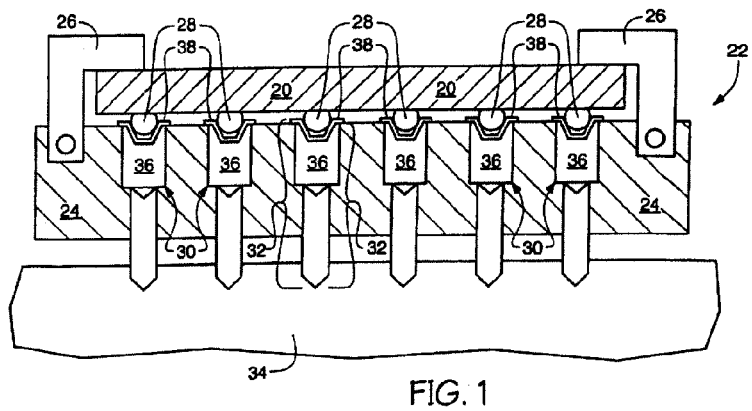

FIG. 1

Figure 6C:
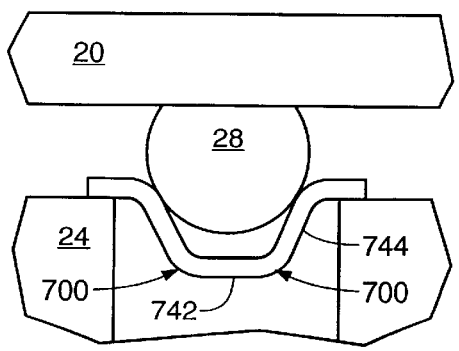

FIG. 6C, change reference numeral "700" (on the left side of the figure) to -- 738 --, and shorten the lead line shorten the lead line extending from reference numeral "838"
Replace Fig. 6C with the following:

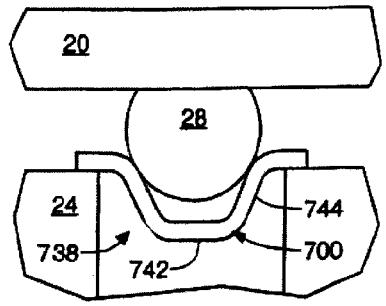

FIG. 6C

Figure 6D:
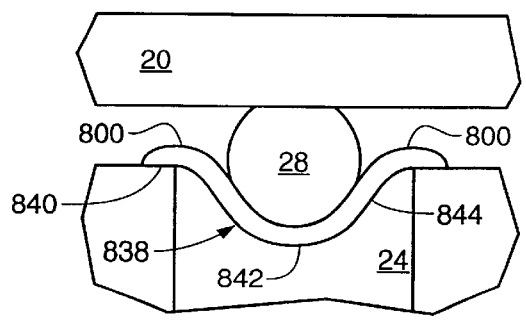

FIG. 6D, shorten the lead line extending from reference numeral "838"

UNITED STATES PATENT AND TRADEMARK OFFICE
CERTIFICATE OF CORRECTION

PATENT NO. : 6,648,654 B1 Page 2 of 5
DATED : November 18, 2003
INVENTOR(S) : David R. Hembree It is certified that error appears in the above-identified patent and that said Letters Patent is hereby corrected as shown below:

Drawings (cont'd),
Replace Fig. 6D with the following:

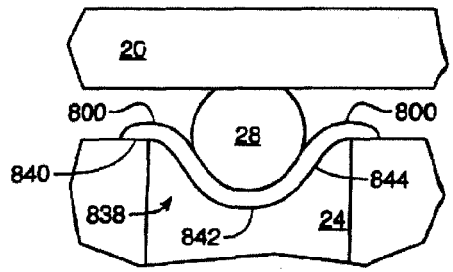

FIG. 7, add reference numeral -- 40 -- with appropriate lead line
Replace Fig. 7 with the following:

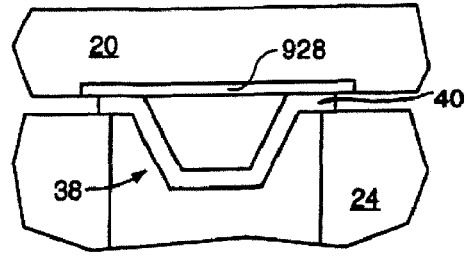

Figure 12C:
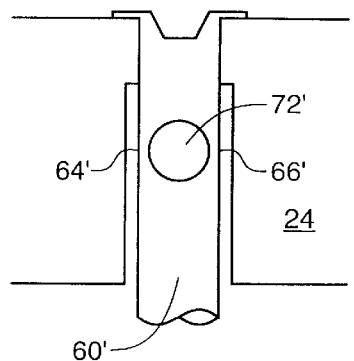
Figure 12D:
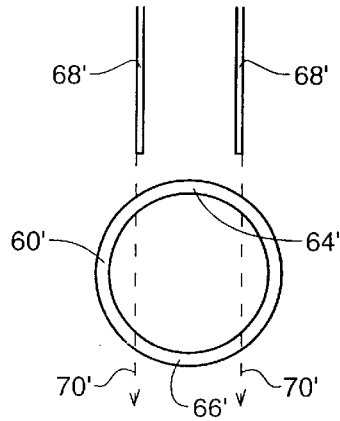
Figure 12E:
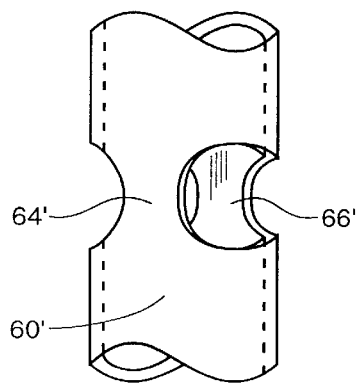

FIG. 12C, change reference numeral "64" to -- 65 --; change "66" to -- 67 --; and change "72" to -- 73 --
Replace Fig. 12C with the following:

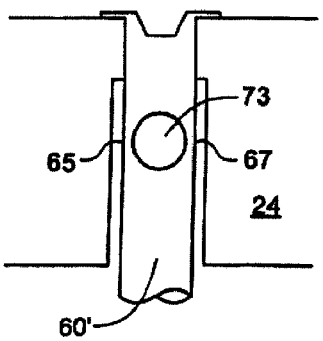

UNITED STATES PATENT AND TRADEMARK OFFICE
CERTIFICATE OF CORRECTION

PATENT NO. : 6,648,654 B1
DATED : November 18, 2003
INVENTOR(S) : David R. Hembree It is certified that error appears in the above-identified patent and that said Letters Patent is hereby corrected as shown below:

Drawings (cont'd),
FIG. 12D, change "64" to -- 65 --; change "66" to -- 67 --; change "68" (both occurrences) to -- 69 --; and change "70" to -- 71 --
Replace Fig. 12D with the following:

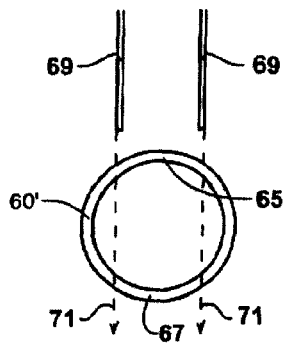

FIG. 12D

FIG. 12E, change "64" to -- 65 -- and change "66" to -- 67 --
Replace Fig. 12E with the following:

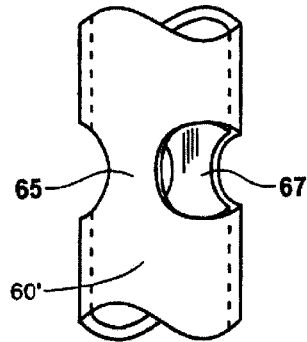

FIG. 12E

Figure 12F:
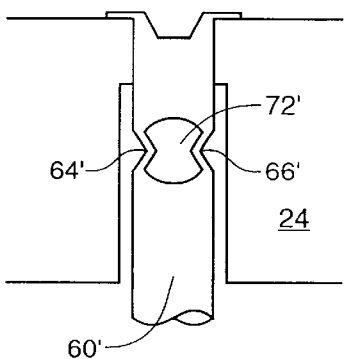

FIG. 12F, change "64" to -- 65 --; change "66" to -- 67 --; and change "72" to -- 73 --

UNITED STATES PATENT AND TRADEMARK OFFICE
CERTIFICATE OF CORRECTION

PATENT NO. : 6,648,654 B1
DATED : November 18, 2003
INVENTOR(S) : David R. Hembree It is certified that error appears in the above-identified patent and that said Letters Patent is hereby corrected as shown below:

Drawings (cont'd),
Replace Fig. 12F with the following:

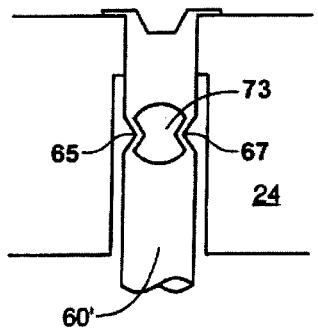
FIG. 12F

Figure 15C:
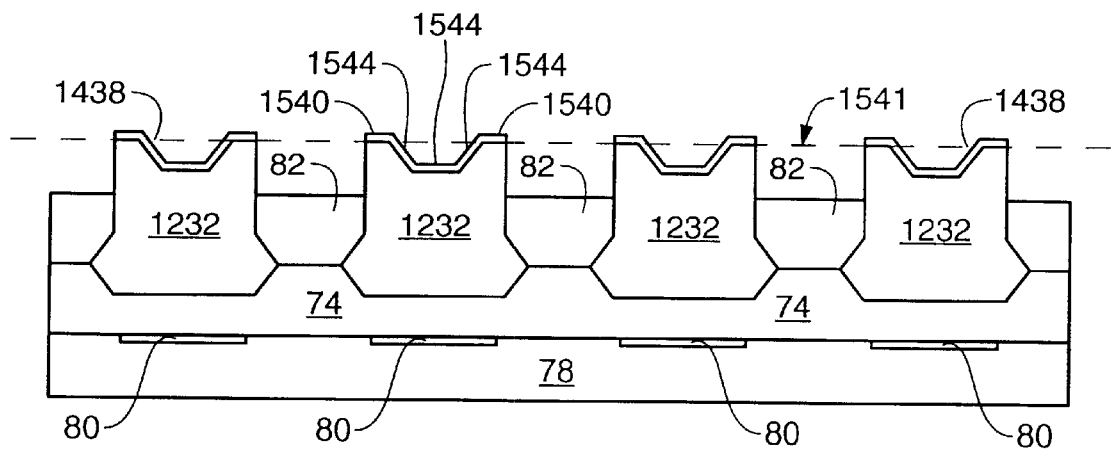

FIG. 15C, change "1544" (at the top center of the figure) to -- 1542 --
Replace Fig. 15C with the following:

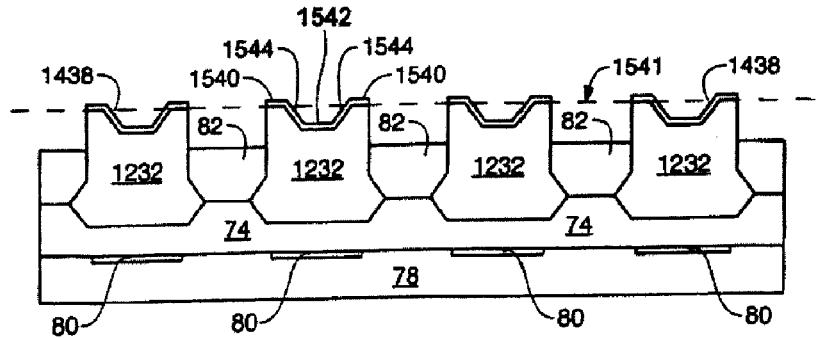
FIG. 15C

Column 2,
Line 39, delete the apostrophe after "Socket"
Line 45, change "In." to -- ln. --

Column 4,
Line 24, change the semicolon after "spears" to a comma

UNITED STATES PATENT AND TRADEMARK OFFICE
CERTIFICATE OF CORRECTION

PATENT NO.    : 6,648,654 B1
DATED         : November 18, 2003
INVENTOR(S)   : David R. Hembree It is certified that error appears in the above-identified patent and that said Letters Patent is hereby corrected as shown below:

<u>Column 9,</u>
Line 7, change "inprocess" to -- in-process --

<u>Column 10,</u>
Line 49, after "one" and before "strip" insert -- resilient temporarily deformable -- and before "central" insert -- common --
Line 51, after "one" and before "strip" insert -- resilient temporarily deformable -- and before "central" insert -- common --

Signed and Sealed this

Twenty-first Day of June, 2005

JON W. DUDAS
*Director of the United States Patent and Trademark Office*